United States Patent
Chao

(10) Patent No.: US 8,299,491 B2
(45) Date of Patent: Oct. 30, 2012

(54) PHOSPHOR COATING METHOD FOR FABRICATING LIGHT EMITTING SEMICONDUCTOR DEVICE AND APPLICATIONS THEREOF

(75) Inventor: Tzu-Hao Chao, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

(21) Appl. No.: 13/288,939

(22) Filed: Nov. 3, 2011

(65) Prior Publication Data

US 2012/0049231 A1    Mar. 1, 2012

Related U.S. Application Data

(60) Division of application No. 13/013,960, filed on Jan. 26, 2011, which is a continuation of application No. 11/984,775, filed on Nov. 21, 2007, now Pat. No. 7,910,387.

(30) Foreign Application Priority Data

Aug. 29, 2007  (TW) ................................. 96132098 A

(51) Int. Cl.
*H01L 33/00*   (2010.01)
(52) U.S. Cl. .............................. 257/99; 257/98; 257/100
(58) Field of Classification Search .................... None
See application file for complete search history.

(56) References Cited

U.S. PATENT DOCUMENTS

| | | | |
|---|---|---|---|
| 6,120,600 A * | 9/2000 | Edmond et al. | 117/89 |
| 6,642,652 B2 * | 11/2003 | Collins et al. | 313/512 |
| 6,650,044 B1 * | 11/2003 | Lowery | 313/502 |
| 7,041,579 B2 | 5/2006 | Barsky et al. | |
| 7,301,175 B2 * | 11/2007 | Izuno et al. | 257/98 |
| 7,675,075 B2 | 3/2010 | Nagai | |
| 2007/0045761 A1 | 3/2007 | Basin et al. | |
| 2008/0173884 A1 * | 7/2008 | Chitnis et al. | 257/98 |

FOREIGN PATENT DOCUMENTS

| | | |
|---|---|---|
| JP | 2000-208822 | 7/2000 |
| JP | 2002-118293 | 4/2002 |
| JP | 2003046140 | 2/2003 |
| JP | 2004266240 | 9/2004 |
| TW | 540169 | 7/2003 |
| TW | I220578 | 8/2004 |

* cited by examiner

*Primary Examiner* — Scott B Geyer
(74) *Attorney, Agent, or Firm* — Andy M. Han; Han IP Law PLLC

(57) ABSTRACT

In one aspect, a light emitting unit comprises: a first semiconductor layer having a first electric property; a second semiconductor layer having a second electric property disposed over the first semiconductor layer; an active layer disposed between the first semiconductor layer and the second semiconductor layer; a first electrode disposed on the second semiconductor layer; a second electrode disposed under the first semiconductor layer; and a phosphor layer disposed on the first semiconductor layer. The phosphor layer covers the active layer and the second semiconductor layer. The first electrode is exposed out of the phosphor layer.

9 Claims, 16 Drawing Sheets

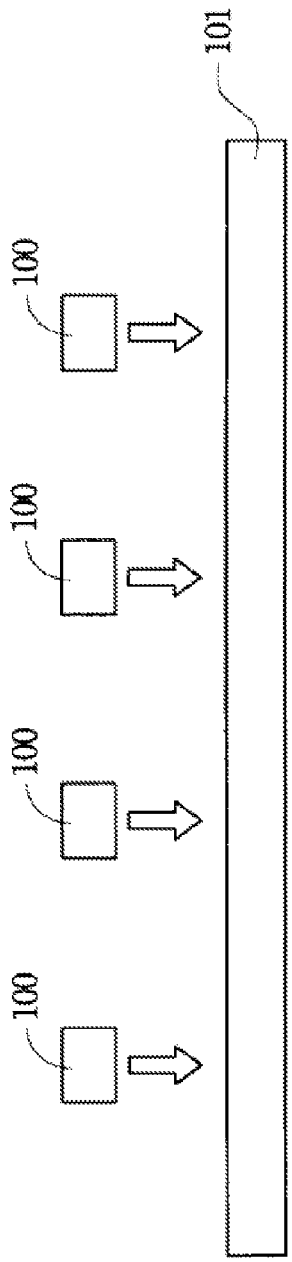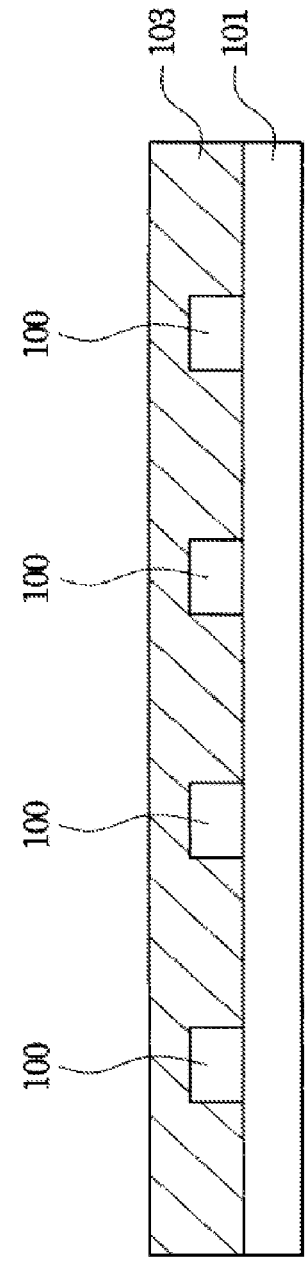
Fig. 1A
(Prior Art)
Fig. 1B
(Prior Art)

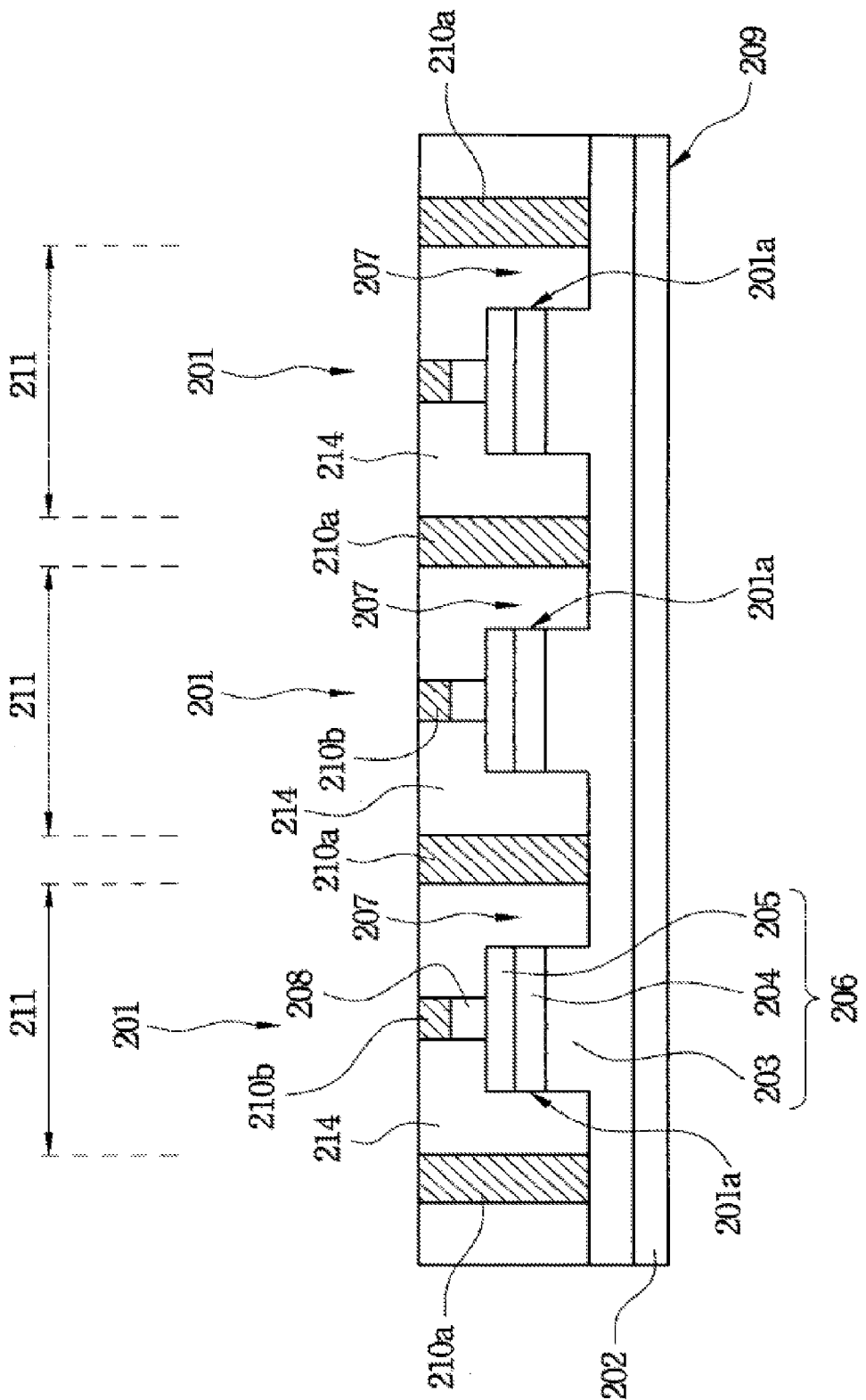

PHOSPHOR COATING METHOD FOR FABRICATING LIGHT EMITTING SEMICONDUCTOR DEVICE AND APPLICATIONS THEREOF

CROSS-REFERENCE TO RELATED APPLICATION

This is a Divisional Application of U.S. patent application Ser. No. 13/013,960, filed on Jan. 26, 2011, which claims priority from U.S. patent application Ser. No. 11/984,775 (issued as U.S. Pat. No. 7,910,387), filed on Nov. 21, 2007 and claiming priority from Taiwan Patent Application No. 096132098, filed on Aug. 29, 2007, which applications are hereby incorporated in their entirety by reference.

BACKGROUND

1. Technical Field

The present disclosure relates to a method for fabricating light emitting semiconductor device and applications thereof, and particularly relates to a wafer level light emitting semiconductor device and applications thereof.

2. Background of the Present Disclosure

Light emitting semiconductor devices having advantages of low power consumption, less heat generation, long life, small size, impact tolerance, high speed, free of mercury and good optical performance have been applied as a light source with steady wavelength in various electronic devices. The brightness and operational life of a light emitting diode (LED) device have been tremendously improved along with the development of the optical technology, and so LED devices may serve as the primary light source of electronic devices in the future.

An LED device with white light is typically made by a LED die encapsulated by a phosphor compound mixed with at least one phosphor, whereby the phosphor is activated by a portion of the blue light emitting from the LED die to derive the blue light into yellow light, and the yellow light is then mixed with the other portion of the blue light to produce white light which in turn emits from the LED device.

Conventionally, the steps for coating the phosphor compound onto the LED die are conducted in the device packaging process. During the packaging process, a die should be mounted onto a substrate prior to the phosphor compound being coated thereon. However, since the phosphor compound is directly blanketed over the LED die, the phosphor mixed in the fluid compound may be precipitated to the periphery of the LED die during the compound coating process. Furthermore, the fluid compound may be aggregated on the lateral side of the LED die, so the resulting LED package may have a horizontal thickness greater than the vertical thickness thereof. Thus the initial blue light provide by the LED die and the yellow light derived from the phosphor cannot be mixed adequately, resulting in the light emitted laterally from the LED package having a color temperature different from light emitted vertically form the LED package. In addition, the brightness of the LED package may be decreased.

To resolve these problems, an advanced method has been applied. FIGS. 1A to 1F illustrate cross-sectional views of a LED packaging process in accordance with a conventional packaging method. First pluralities of LED die units 100 are flipped and mounted on a substrate, such as a silicon substrate 101. A conformal coating process, such as screen painting or a thick film process, is then conducted to form a photoresist layer 103 over the substrate 101 and the LED die units 100, and a plurality of openings 104 are formed in the photoresist layer 103 by a patterning process to expose the LED die units 100. Subsequently, a compound 105 mixed with phosphor is filled into the openings 104. A backing process is then conducted prior to the photoresist layer 103 being peeled. The packaged LED die units are then separated from the substrate 101; and each of the die units 100 is bonded with wires to from a LED device.

However, the mounting steps may affect the accuracy for aligning LED die units 100 mounted on the substrate 101 with the openings 104 formed in the photoresist 104 during the LED device batch manufacturing process. The phosphor compound may not encapsulate the LED die in equilibrium. Thus light provided by the resulting LED device may have an undesired color temperature, and the brightness of the LED device may be decreased. Also, the heat-dispersing efficiency of the LED device may be reduced by the disequilibrium of phosphor compound coated on the LED die.

SUMMARY

Therefore, it is desirable to provide an improved method for coating a LED die a phosphor compound to form a LED device with high brightness and heat-dispersing efficiency by lower cost.

In accordance with one aspect of the present disclosure, a phosphor coating method for fabricating a light-emitting semiconductor is provided. The phosphor coating method comprises the steps as follows: First a light emitting semiconductor wafer having a plurality of die units formed thereon is provided, and a photoresist is then formed on the light emitting semiconductor wafer to cover the die units. A pattern process is conducted to form a plurality of openings associated with the die units, whereby each die can be exposed via one of the openings. Subsequently, a compound mixed with phosphor is filled into the openings.

In accordance with another aspect of the present disclosure, a method for fabricating a light emitting semiconductor device is provided, wherein the fabricating method comprises the steps as follows: First a light emitting semiconductor wafer having a plurality of die units formed thereon is provided, and a photoresist is then formed on the light emitting semiconductor to cover the die units. A pattern process is conducted to form a plurality of openings associated with the die units, whereby each die can be exposed via one of the openings. Subsequently, a compound mixed with phosphor is filled into the openings. A dicing process is then conducted to separate the die units from the light-emitting semiconductor wafer after the photoresist is removed.

In accordance with yet another aspect of the present disclosure, a light emitting semiconductor wafer coated with phosphor is provided, wherein the light emitting semiconductor wafer comprises a plurality of light emitting die units defined by at least one trench. Each light emitting die unit comprises a first semiconductor epitaxy layer with a first electric property, an active layer, a second semiconductor epitaxy layer with a second electric property, a first electrode, a second electrode and a patterned phosphor coating layer, wherein the active layer, the second semiconductor epitaxy layer and the first electrode are sequentially piled on the first semiconductor epitaxy layer, And the second electrode is electrically connected to the first electrode via the second semiconductor epitaxy layer, the active layer and the first semiconductor epitaxy layer. The patterned phosphor-coating layer is deposited on the second semiconductor epitaxy layer to encapsulate a portion of the second semiconductor epitaxy layer, the active layer, and the first semiconductor epitaxy layer that are exposed by the trench. The patterned phosphor coating layer also includes at least opening to expose the first electrode of the light emitting die unit.

In accordance with the above embodiments, the features of the present disclosure are to conduct the phosphor coating process on the semiconductor wafer, wherein a photolithography process rather than a conventional die attachment or bonding process is applied to fabricate a plurality of light emitting semiconductor devices. A conformal photoresist layer having a plurality of openings is form over the light emitting semiconductor wafer to surround a plurality of light emitting semiconductor die units. The openings are associated with the light emitting die units. Subsequently, a compound mixed with phosphor is filled into the openings. Since a reticle technology is applied to form the openings associated with the light emitting die units, each of the openings can precisely align one of the light emitting die units, and the patterned photoresist (the revetment surrounding each die unit) can have an accurate predetermined level. Thus the phosphor compound that is filled into each of the opening can be accurately controlled in a predetermined volume, so as to avoid additional waste of phosphor compound. Accordingly light emitting die unit can be encapsulated in equilibrium to improve the brightness of the light emitting die units.

In one embodiment of the present disclosure, a light emitting unit comprising a first semiconductor layer, a second semiconductor layer, an active layer, a first electrode, a second electrode and a phosphor layer is provided. The first semiconductor layer has a first electric property. The second semiconductor layer has a second electric property and is disposed above the first semiconductor layer. The active layer is disposed between the first semiconductor layer and the second semiconductor layer. The first electrode is disposed on the second semiconductor layer. The second electrode is disposed under the first semiconductor layer. The phosphor layer is disposed on the first semiconductor layer. The phosphor layer covers the active layer and the second semiconductor layer. The first electrode is exposed out of the phosphor layer.

In one embodiment of the present disclosure, the first semiconductor layer includes a top surface and a bottom surface opposite to the top surface. The top surface includes a central portion and a peripheral portion lower than the central portion. The active layer is disposed on the central portion. The second electrode is disposed on the bottom surface. The central portion and part of the peripheral portion are covered by the phosphor layer.

In one embodiment of the present disclosure, the first semiconductor layer includes a top surface and a bottom surface opposite to the top surface. The top surface includes a first portion and a second portion lower than the first portion. The active layer is disposed on the first portion. The second electrode is disposed on the bottom surface. The first portion and part of the second portion are covered by the phosphor layer.

In one embodiment of the present disclosure, the first electric property and the second electric property are n type and p type, respectively.

In one embodiment of the present disclosure, the first electric property and the second electric property are p type and n type, respectively.

In one embodiment of the present disclosure, a carrier is disposed under the second electrode.

In another one embodiment of the present disclosure, a light emitting unit comprising a first semiconductor layer, a second semiconductor layer, an active layer, a first electrode, a second electrode and a phosphor layer is provided. The first semiconductor layer has a first electric property. The second semiconductor layer has a second electric property and is disposed above the first semiconductor layer. The active layer is disposed between the first semiconductor layer and the second semiconductor layer. The first electrode is disposed on the second semiconductor layer. The second electrode is disposed on the first semiconductor layer. The phosphor layer is disposed on the first semiconductor layer. The phosphor layer covers the active layer and the second semiconductor layer. The first electrode and the second electrode are exposed out of the phosphor layer.

In another one embodiment of the present disclosure, the first semiconductor layer includes a top surface and a bottom surface opposite to the top surface. The top surface includes a first portion, a second portion lower than the first portion and a third portion lower than the second portion. The active layer is disposed on the first portion. The second electrode is disposed on the second portion. The first portion, part of the second portion and part of the third portion are covered by the phosphor layer.

In another one embodiment of the present disclosure, the first semiconductor layer includes a top surface and a bottom surface opposite to the top surface. The top surface includes a first central portion, a second central portion lower than the first central portion and a peripheral portion lower than the second central portion. The active layer is disposed on the first central portion. The second electrode is disposed on the second central portion. The first central portion, part of the second central portion and part of the peripheral portion are covered by the phosphor layer.

In another one embodiment of the present disclosure, the first electric property and the second electric property are p type and n type, respectively.

In another one embodiment of the present disclosure, a carrier is disposed under the second electrode.

In another one embodiment of the present disclosure, a carrier is disposed under the first semiconductor layer.

BRIEF DESCRIPTION OF THE DRAWINGS

The foregoing aspects and many of the attendant advantages of this present disclosure will become more readily appreciated as the same becomes better understood by reference to the following detailed description, when taken in conjunction with the accompanying drawings, wherein:

FIGS. 1A to 1F illustrate cross-sectional views of a LED packaging process in accordance with a conventional packaging method.

FIG. 2F illustrates a cross-sectional view of a portion of the light emitting semiconductor wafer 200, after a phosphor-encapsulating layer 214 in each of the opening 211.

DETAILED DESCRIPTION OF THE PREFERRED EMBODIMENTS

The foregoing aspects and many of the attendant advantages of this present disclosure will become more readily appreciated and better understood by reference to the following detailed description of preferred embodiment as a method for fabricating a LED device, when taken in conjunction with the accompanying drawings. It should be appreciated that the features and present disclosure concepts may be applied on other light emitting semiconductor device, such as an ultra-high efficiency LED or a laser diode.

Figure 1C:
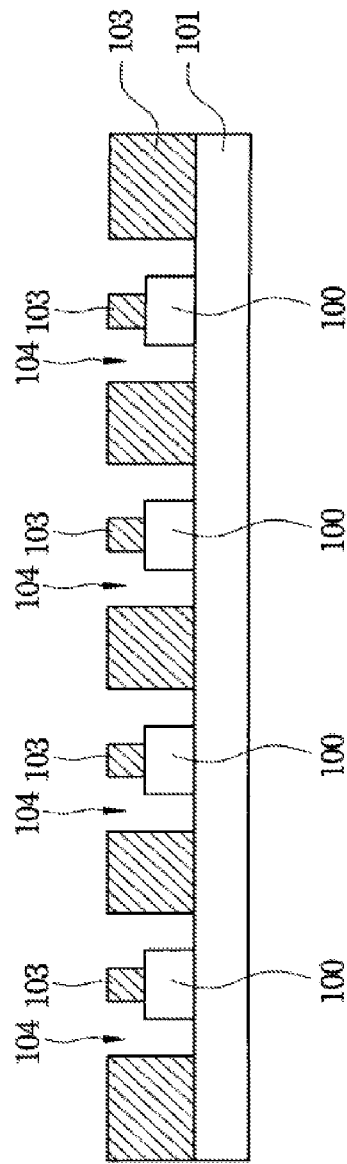
Figure 1D:
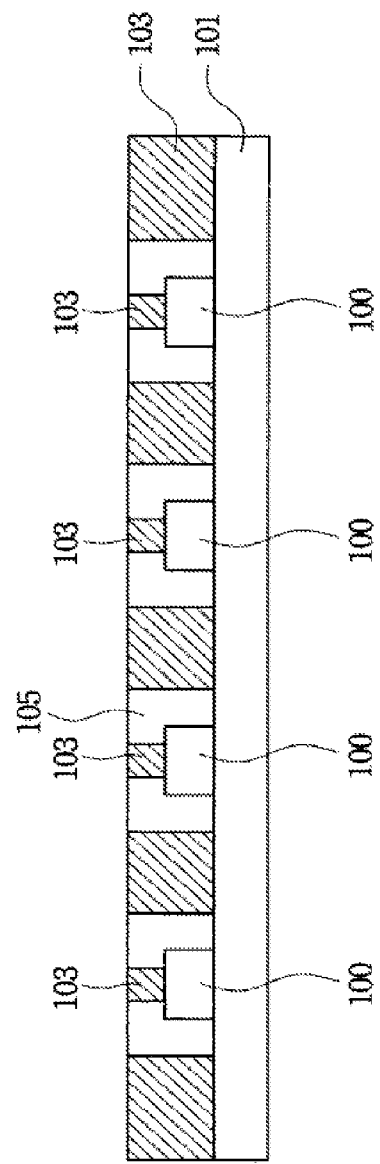
Figure 1E:
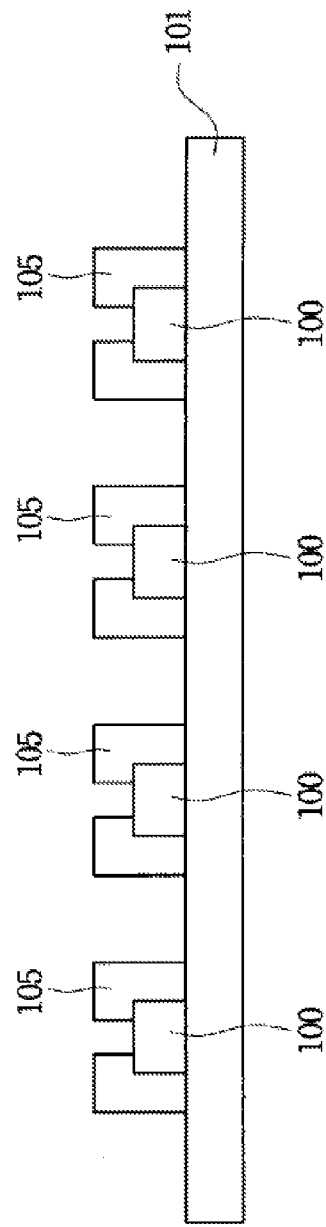
Figure 1F:
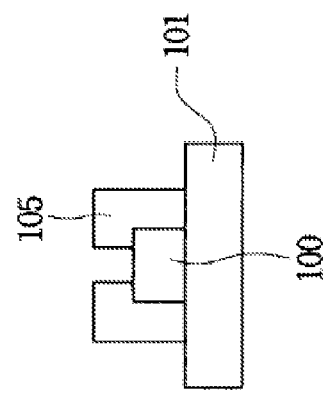
Figure 2A:
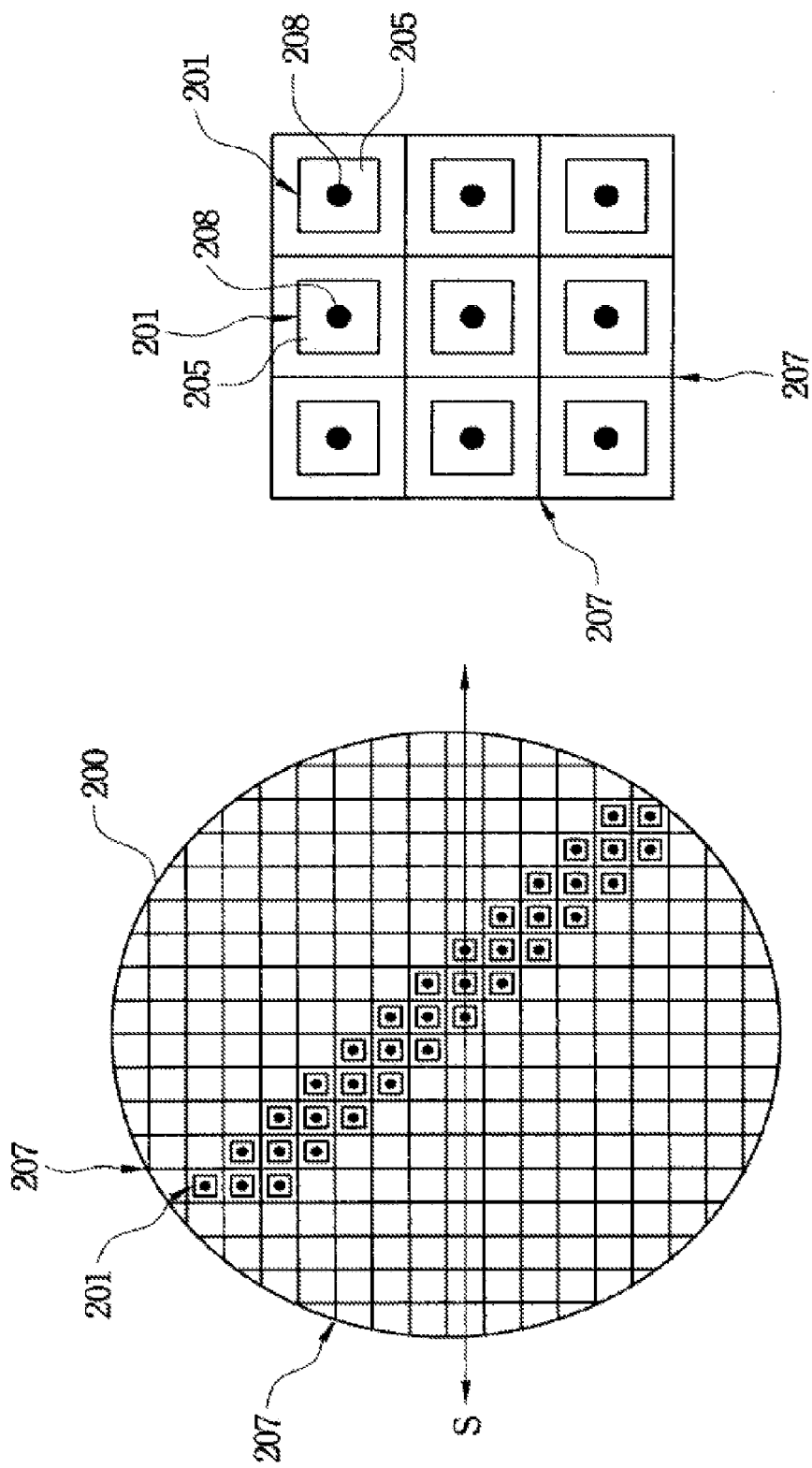
FIG. 2A illustrates a vertical view of a light emitting semiconductor wafer and partial magnitude in accordance with a preferred embodiment of the present disclosure.

FIG. 2A illustrates a vertical view of a light emitting semiconductor wafer and partial magnitude in accordance with a preferred embodiment of the present disclosure. FIGS. 2B to 2H illustrate a series of partial cross-sectional views of a manufacture process for fabricating a light emitting semiconductor device along the line S shown in FIG. 2A.

Figure 2B:
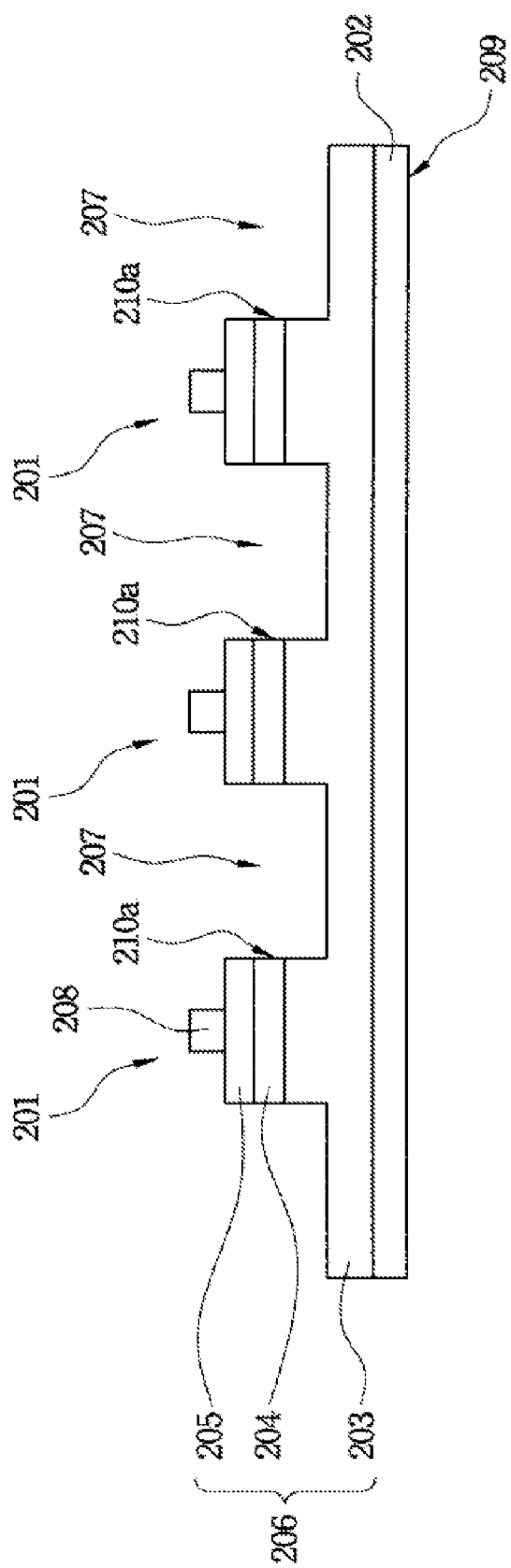
FIG. 2B illustrates a cross-sectional view of a portion of a light emitting semiconductor wafer 200 in accordance with a preferred embodiment of the present disclosure.

First a light emitting semiconductor wafer 200 having a plurality of die units 201 is provided (referring to FIG. 2B). In the preferred embodiment of the present disclosure, the light emitting semiconductor wafer 200 comprises a p type semiconductor epitaxy layer 203, an active layer 204 and an n type semiconductor epitaxy layer 205 piled in sequence to form a semiconductor epitaxy structure 206. At least one trench 207 that is formed in the light emitting semiconductor wafer 200 vertically extending from the top surface of the p type semiconductor epitaxy layer 203 into the active layer 204 and the n type semiconductor epitaxy layer 205 is used to identify the die units 201 on the light emitting semiconductor wafer 200.

In the preferred embodiment of the present disclosure, each of the die units 201 further comprises a first electrode 208, formed on the n type semiconductor epitaxy layer 205, and a second electrode 209 that is consisted of a portion of a conductive substrate 202 used to grow the semiconductor epitaxy structure 206. The first electrode 208 is electrically connected to the second electrode 209 via the p type semiconductor epitaxy layer 203, the active layer 204, and the p type semiconductor epitaxy layer 205.

Figure 2C:
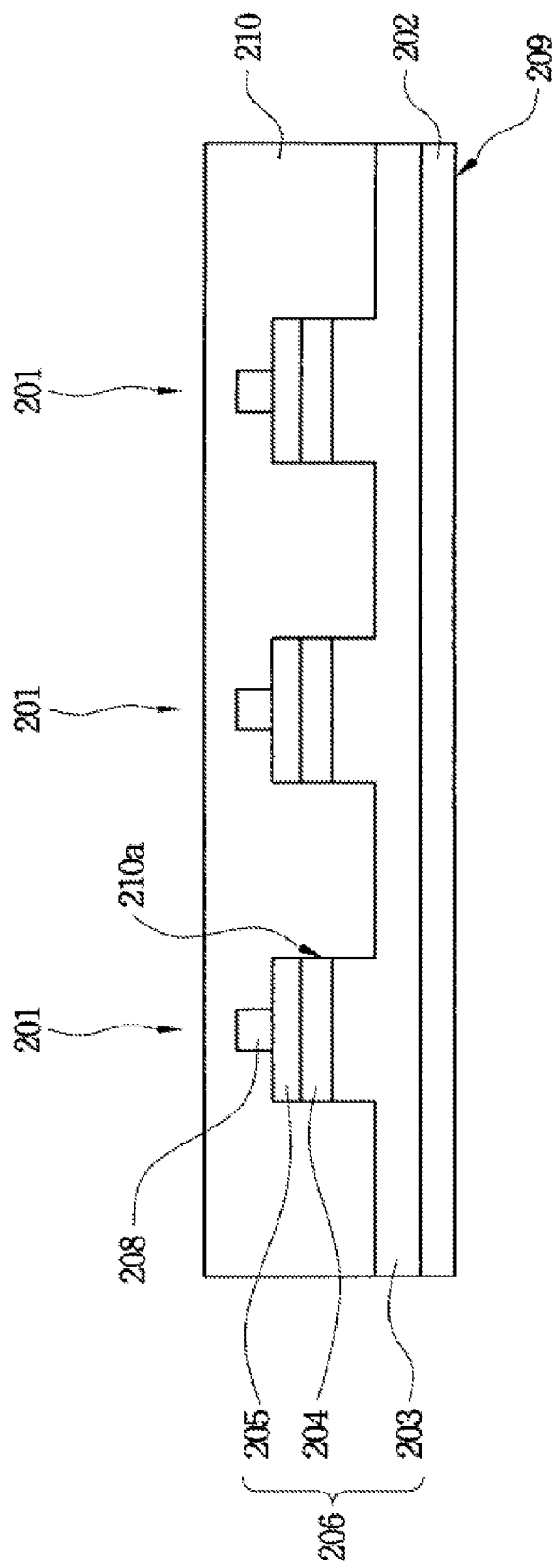
FIG. 2C illustrates a cross-sectional view of a portion of the light emitting semiconductor wafer 200 shown in FIG. 2B, after a photoresist 210 is formed thereon.
Figure 2D:
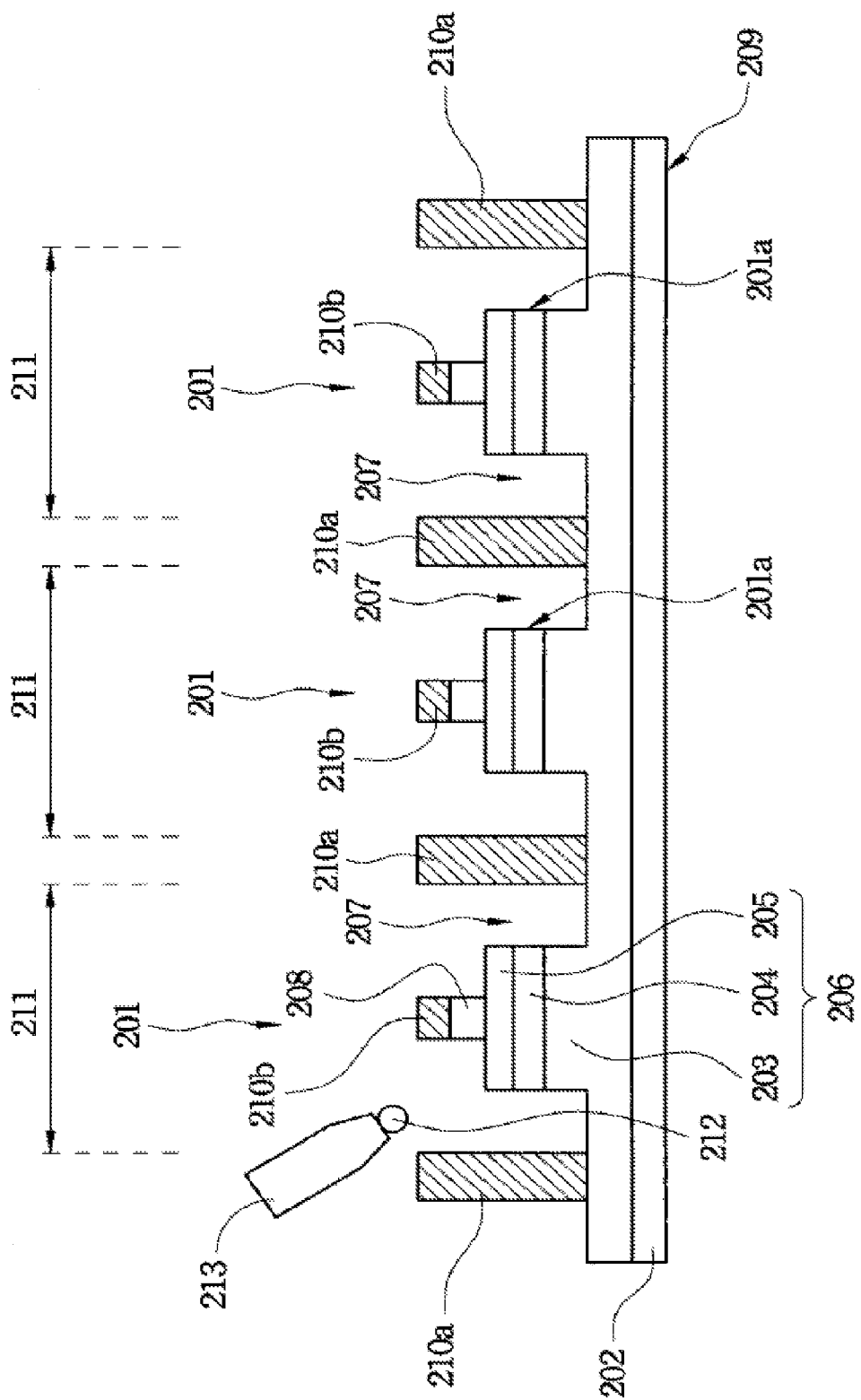
FIG. 2D illustrates a cross-sectional view of a portion of the light emitting semiconductor wafer 200, after the pattern process is conducted on the photoresist 210.
Figure 2E:
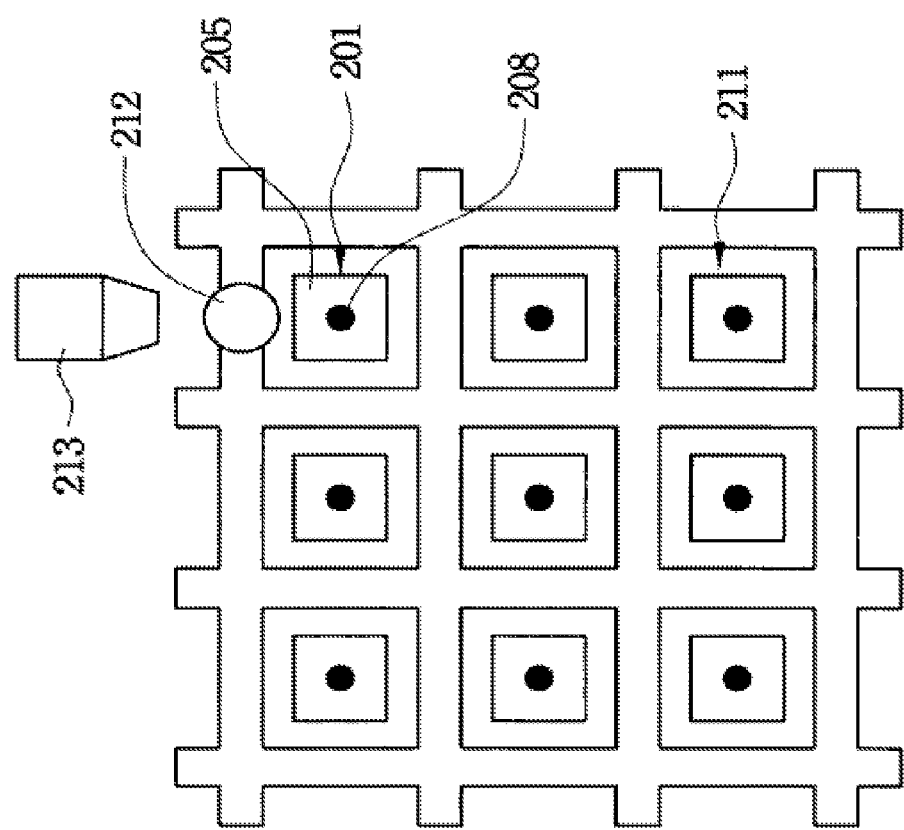
FIG. 2E illustrates a vertical view of a portion of the light emitting semiconductor wafer 200, after the pattern process is conducted on the photoresist 210.
Figure 2G:
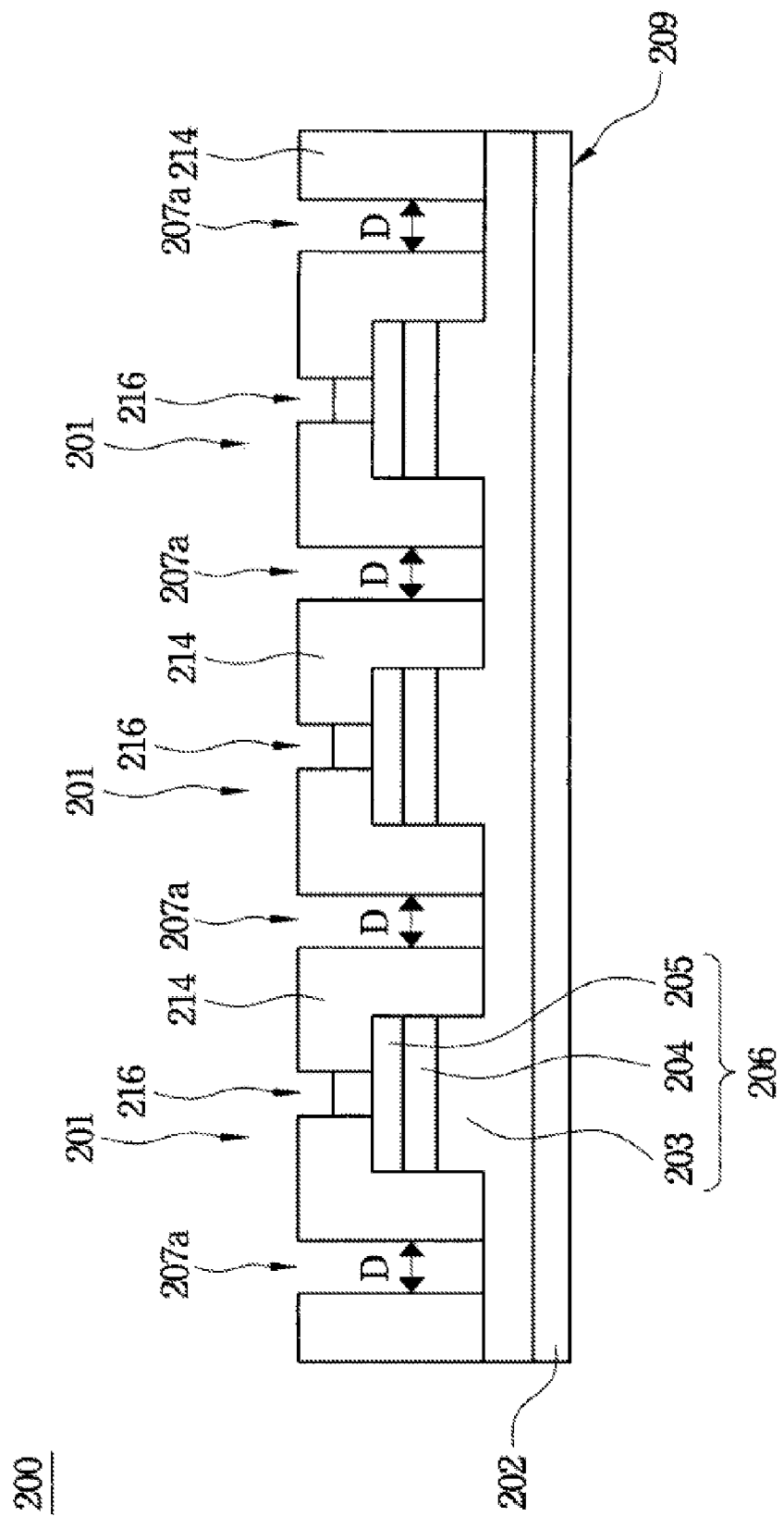
FIG. 2G illustrates a cross-sectional view of a portion of the light emitting semiconductor wafer 200, after the patterned photoresist is removed.
Figure 2H:
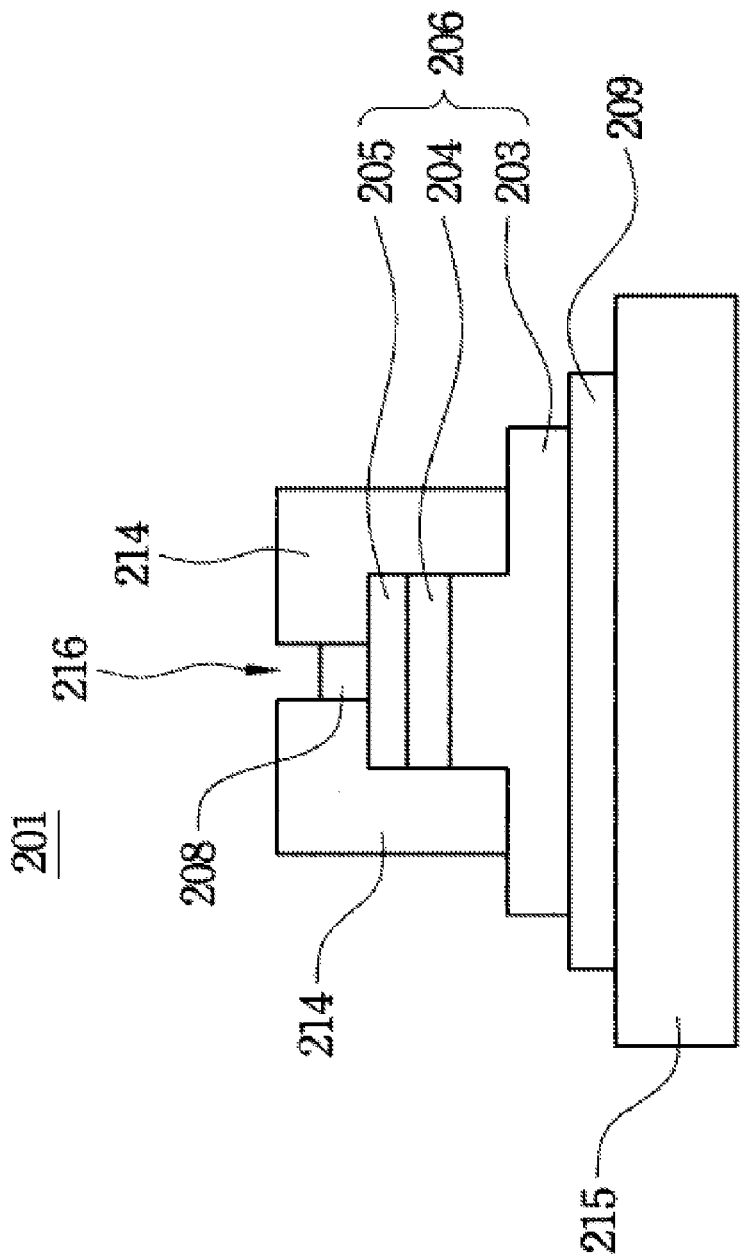
FIG. 2H illustrates a cross-sectional view of a packaged die unit 201 in accordance with a preferred embodiment of the present disclosure.

FIG. 2C illustrates a cross-sectional view of a portion of the light emitting semiconductor wafer 200 shown in FIG. 2B, after a photoresist 210 is formed thereon. A screen-printing or a thick film process is applied to form the photoresist layer 210 for blanketing over the die units 201. A mask (not shown) is then applied to conduct an exposure and developing process for forming a plurality of openings 211 in the photoresist layer 210 associated with the die units 201. FIG. 2D and FIG. 2E respectively illustrate a cross-sectional view and a vertical view of a portion of the light emitting semiconductor wafer 200, after the pattern process is conducted on the photoresist 210, wherein each opening 211 aligns with one of the die units 201, and each opening 211 has a size greater than the size of the corresponding die unit 201 for exposing thereof. Thus the portion of the patterned photoresist 210 used to identify the openings 211 may be remained on a portion of the trench 207 to serve as a plurality of revetments (hereinafter referred to as revetments 210a), and each opening 211 can expose a corresponding die unit 201 and the other portion of the trench 207 so as to separate the die unit 201 from the revetments 210a. In some embodiments of the present disclosure, each of the revetments 210a has a level higher than or equal to the level of the corresponding die unit 201. In the embodiments of the present disclosure, the shape and size of each opening 211 may be designed according to the predetermined shape and size of the corresponding die unit 201.

In some embodiments of the present disclosure, another portion of the patterned photoresist 210, denoted as 210b, may be remained in each of the openings 211 to cover the first electrode 208 of each corresponding die unit 201.

After the photoresist 210 is patterned, a compound 212 mixed with phosphor is filled into the openings 211 via a compound filler 213. Since the size of each opening 211 is greater than the size of the corresponding die unit 201, and each of the revetments 210a has a level higher than or equal to the level of the corresponding die unit 201. The phosphor compound 212 filled in these openings 211 not only blankets over the top surface of the n type semiconductor epitaxy layer 205 of each die unit 201, but also fills in the gap between the revetment 210a and the side wall 201a of the die unit 201 perpendicular with the top surface of the n type semiconductor epitaxy layer 205. Thus the phosphor compound 212 can be accurately filled into each of the opening 211 in a predetermined volume.

In some embodiments of the present disclosure, the phosphor compound 212 is consisted of organic polymers mixed by phosphoric materials. Light emitting from the die units 201 can activate the phosphoric materials from which some visible light with red, yellow, green, blue or other colors may be derived. In the preferred embodiment of the present disclosure, the phosphor compound 212 is consisted of organic polymers or silica gel mixed by phosphoric materials. The openings 211 are filled with phosphor compound 212 by a continuous filling step or by a discontinuous filling step adjusted according to the design of the patterned photoresist 210a to entirely encapsulate the die units 201 without causing any voids.

Subsequently, a baking process is conducted to solidify the phosphor compound 212 so as to form a phosphor-encapsulating layer 214 in each of the openings 211 (referring to FIG. 2F). The remaining portions of the photoresist 210a and 210b are then removed to form the structure shown in FIG. 2G to complete the phosphor coating process. In some embodiments of the present disclosure, an exposure-development process or a plasma-etching process is applied to remove the remaining portions of the photoresist 210a and 210b. After the remaining portions of the photoresist 210a are removed, the resultant trench 207a can be exposed to separate each of the die units 201 by a certain distance D and serve as a cutting street during a subsequent dicing process. After the remaining portions of the photoresist 210b are removed, a plurality of openings 216 are formed in each of the phosphor encapsulating layers 214 used to encapsulate one of the die unites 211, so as to expose a portion of the corresponding first electrode 208 and to provide a bonding area for a subsequent wire bonding process.

Subsequently, a dicing process is conducted to separate the die units 201 from the light emitting semiconductor wafer 200 coated with phosphor along the cutting street. Each of the separated die units 201 having a phosphor-encapsulating layer 214 thereon is then subjected to a bonding process and a packaging process to form a light emitting semiconductor device having a die unit 201 electrically connected to a chip carrier 215 (referring to FIG. 2H).

FIGS. 3A to 3E illustrate a series of partial cross-sectional views of a manufacturing process for fabricating a light emitting semiconductor device in accordance with another embodiment of the present disclosure.

Figure 3A:
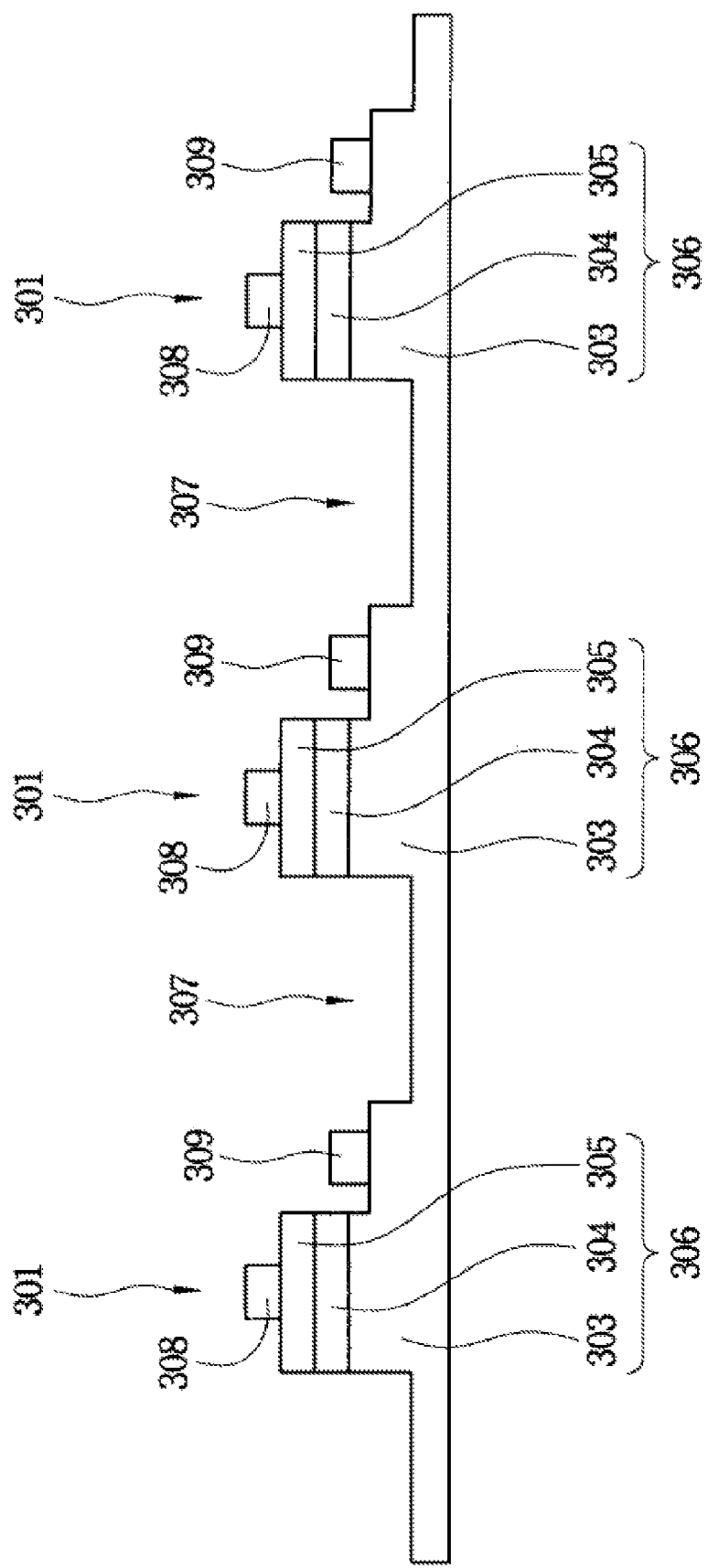
FIGS. 3A to 3E illustrate a series of partial cross-sectional views of a manufacture process for fabricating a light emitting semiconductor device in accordance with another embodiment of the present disclosure.

First a light emitting semiconductor wafer 300 having a plurality of die units 301 is provided (referring to FIG. 3A). In the preferred embodiment of the present disclosure, the light emitting semiconductor wafer 300 comprises a p type semiconductor epitaxy layer 303, an active layer 304 and an n type semiconductor epitaxy layer 305 piled in sequence to form a semiconductor epitaxy structure 306. At least one trench 307 that is formed in the light emitting semiconductor wafer 300 vertically extending from the top surface of the p type semiconductor epitaxy layer 303 into the active layer 304 and the n type semiconductor epitaxy layer 305 is used to identify the die units 301 on the light emitting semiconductor wafer 300. In the preferred embodiment of the present disclosure, each of the die units 301 further comprises a first electrode 308, formed on the n type semiconductor epitaxy layer 305, and a second electrode 309, formed on the p type semiconductor epitaxy layer 303. The first electrode 308 is electrically connected to the second electrode 309 via the p type semiconductor epitaxy layer 303, the active layer 304, and the p type semiconductor epitaxy layer 305.

Figure 3B:
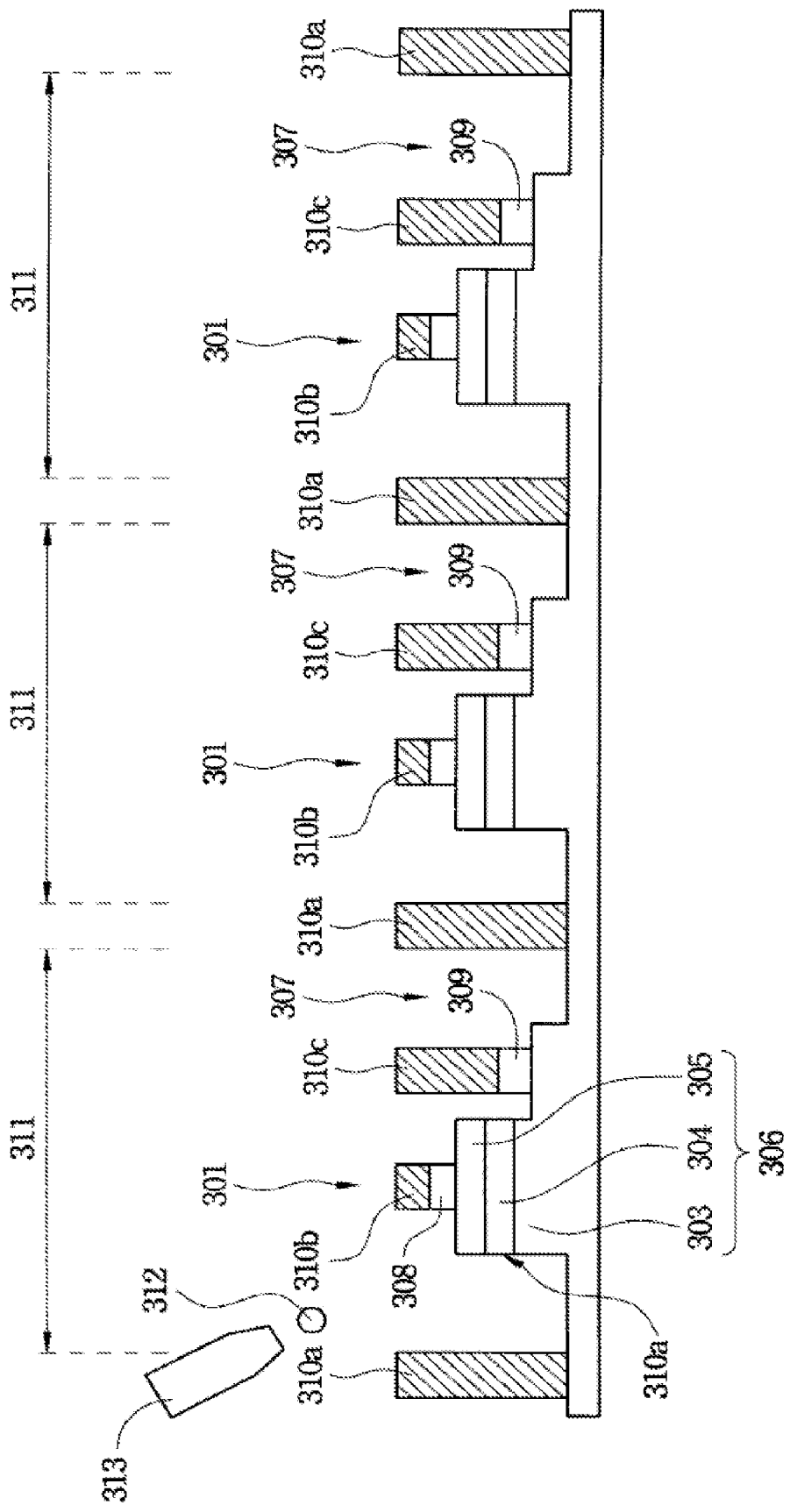

FIG. 3B illustrates a cross-sectional view of a portion of the light emitting semiconductor wafer 300 shown in FIG. 3A, after a photoresist 310 is formed thereon. A screen-printing or a spin-coating process is applied to form the photoresist layer 310 for blanketing over the die units 301. A mask (not shown) is then applied to conduct an exposure and developing process for forming a plurality of openings 311 in the photoresist layer 310 in associate with the die units 301, wherein each opening 311 aligns with a corresponding die units 301, and each opening 311 has a size greater than the size of the corresponding die unit 301 for exposing thereof. Thus the portions of the patterned photoresist 310 used to identify the openings 311 may be remained on a portion of the trench 307 to serve as a plurality of revetments (hereinafter referred to as revetments 310a), and each opening 311 exposes a corresponding die unit 301 and the other portion of the trench 307 so as to separate the die unit 301 from the revetments 310a. In some embodiments of the present disclosure, each of the revetments 310a has a level higher than or equal to the level of the corresponding die unit 301. In the embodiments of the present disclosure, the shape and size of each opening 311 may be designed according to the predetermined shape and size of the corresponding die unit 301.

In some embodiments of the present disclosure, other portions of the patterned photoresist, such as portions 310b and 310c, may be remained in each of the openings 311 to cover the first electrode 308 and the second electrode 309 of each corresponding die unit 301.

After the photoresist 310 is patterned, a compound 312 mixed with phosphor is filled into the openings 311 via a compound filler 313. Since the size of each opening 311 is greater than the size of the corresponding die unit 301, and each of the revetments 310a has a level higher than or equal to the level of the corresponding die unit 301. The phosphor compound 312 filled in these openings 311 not only blankets over the top surface of the n type semiconductor epitaxy layer 305 of each die unit 301, but also fills in the gap between the revetment 310a and the side wall 301a of the die unit 301 perpendicular with the top surface of the top surface of the n type semiconductor epitaxy layer 305. Thus the phosphor compound 312 can be accurately filled into each of the opening 311 with a predetermined volume.

In some embodiments of the present disclosure, the phosphor compound 312 is consisted of organic polymers mixed by phosphoric materials. Light emitting from the die units 301 can activate the phosphoric materials, from which some visible light with red, yellow, green, blue or other colors may be derived. In the preferred embodiment of the present disclosure, the phosphor compound 312 is consisted of organic polymers or silica gel mixed by phosphoric materials. The openings 311 are filled with phosphor compound 312 by a continuous filling step or by a discontinuous filling step by the compound filler 313, and the volume of the phosphor compound 312 can be adjusted according to the design of the patterned photoresist 210a to entirely encapsulate the die units 301 without causing any voids.

Figure 3C:
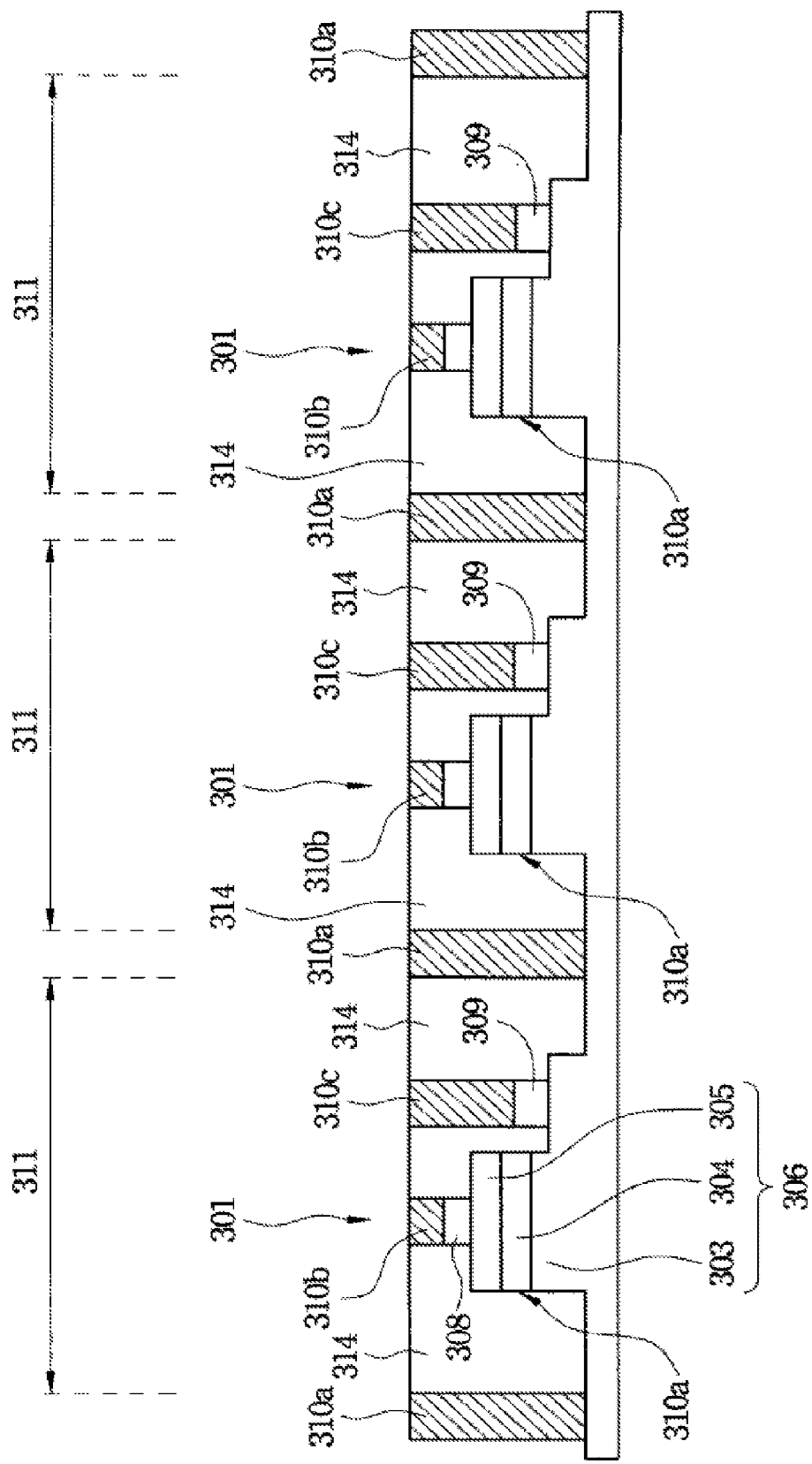
Figure 3D:
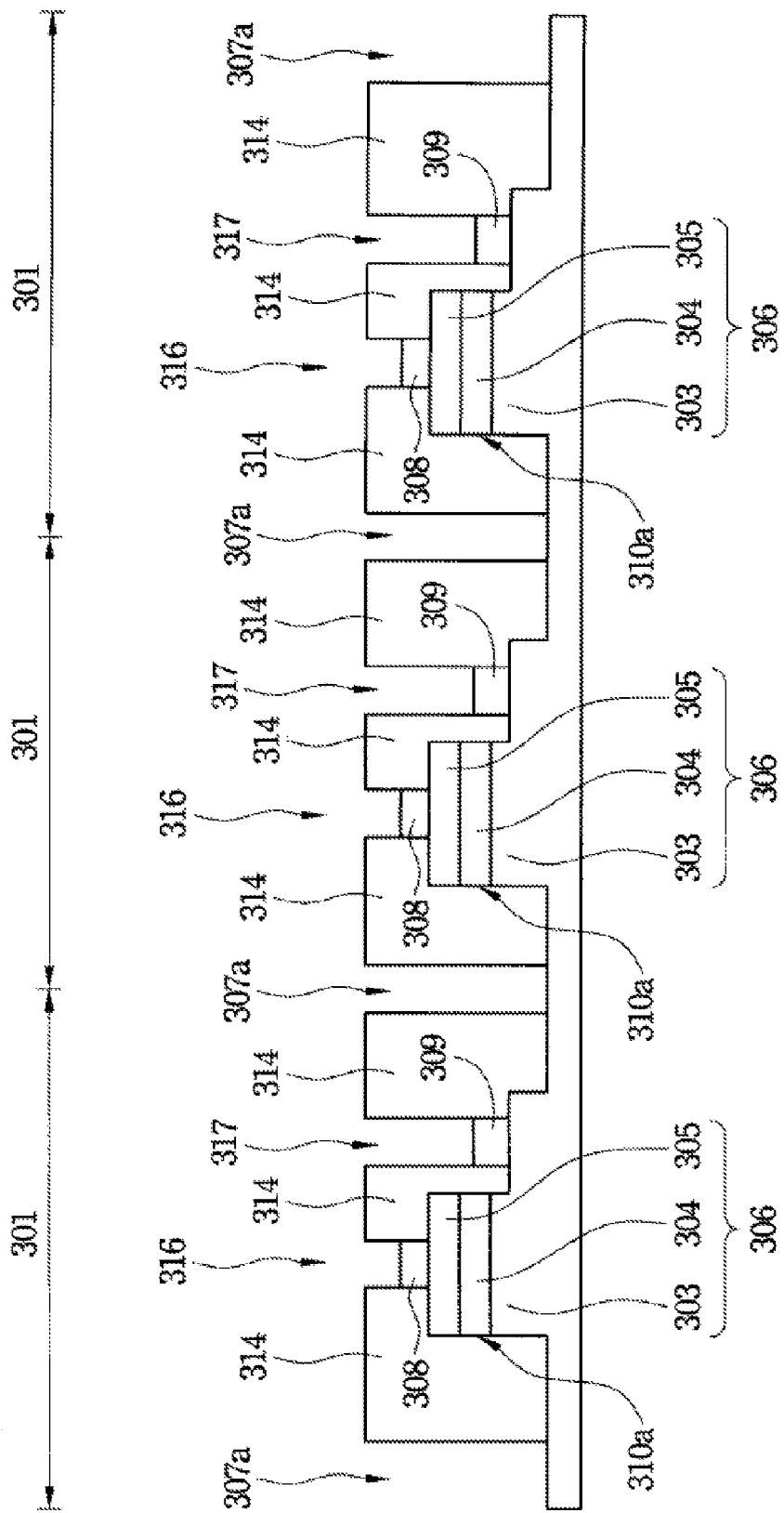
Figure 3E:
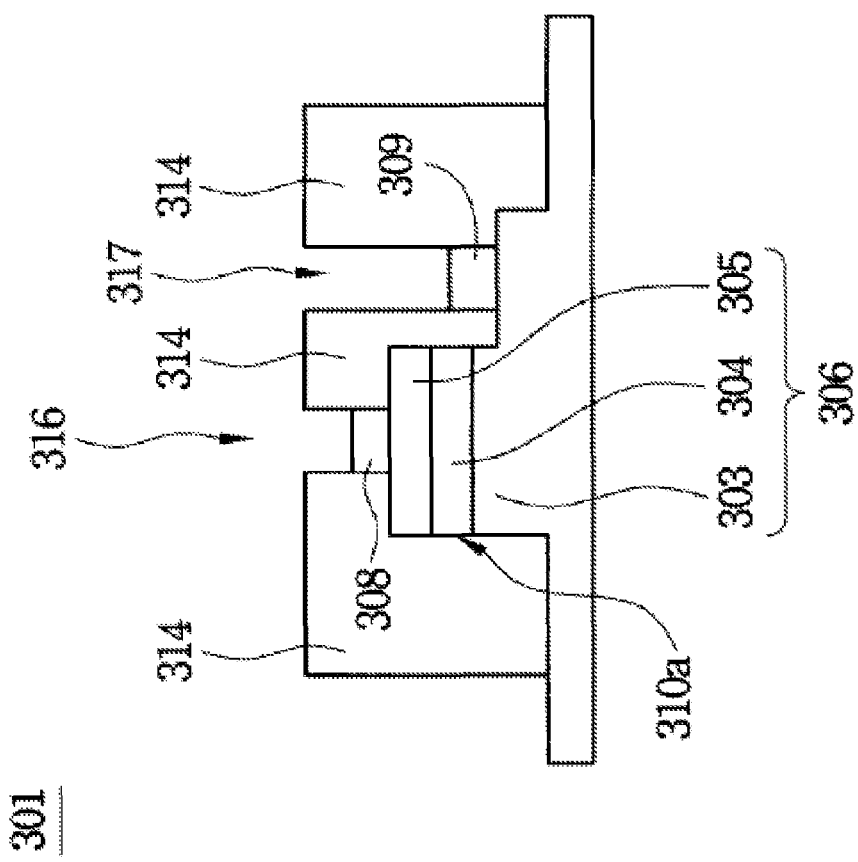

Subsequently, a baking process is conducted to solidify the phosphor compound 312 so as to form a phosphor-encapsulating layer 314 in each of the opening 211 (referring to FIG. 3C). The remaining portions of the photoresist 310a, 310b and 310c are then removed to form the structure shown as FIG. 3D to complete the phosphor coating process. In some embodiments of the present disclosure, an exposure-development process or a plasma etching process is applied to remove the remaining portions of the photoresist 310a, 310b and 310c. After the portions of the photoresist 310a are removed, the resultant trench 307a can be exposed to separate each of the die units 201 for a certain distance D and serve as a cutting street during a subsequent dicing process. After the portions of the photoresist 312b and 312c are removed, a plurality of openings 316 and opening 317 are formed respectively in each of the phosphor-encapsulating layers 314 used to encapsulate one of the die unites 311, so as to expose a portion of the corresponding first electrode 308 and a portion of the corresponding second electrode 309 to provide bonding areas for a subsequent wire bonding process.

Subsequently, a dicing process is conducted to separate the die units 301 from the light emitting semiconductor wafer 300 coated with phosphor along the cutting street. Each of the separated die units 301 having a phosphor-encapsulating layer 314 thereon is then subjected to a bonding process and a packaging process respectively to form a light emitting semiconductor device having a die unit 301 electrically connected to a chip carrier 315 (not shown).

In accordance with the above embodiments, embodiments of the present disclosure conduct the phosphor coating process on the semiconductor wafer, wherein a photolithography process rather than a conventional die attachment or bonding process is applied to fabricate a plurality of light emitting semiconductor devices. A conformal photoresist layer having a plurality of openings is formed over the light emitting semiconductor wafer to surround a plurality of light emitting semiconductor die units. The openings are associated with the light emitting die units. Subsequently, a compound mixed with phosphor is filled into the openings. Since a reticle technology is applied to form the openings associated with the light emitting die units, each of the openings can precisely align one of the light emitting die units, and the patterned photoresist (the revetment surrounding each die unit) can have an accurate predetermined level. Thus the phosphor compound that is filled into each of the openings can be accurately controlled in a predetermined volume, so as to avoid additional waste of phosphor compound. Accordingly, light emitting die units can be encapsulated in equilibrium to improve the brightness of the light emitting die units.

As is understood by a person skilled in the art, the foregoing preferred embodiments of the present disclosure are illustrative of the present disclosure rather than limitations of the present disclosure. The disclosed embodiments are intended to cover various modifications and similar arrangements included within the spirit and scope of the appended claims, the scope of which should be accorded the broadest interpretation so as to encompass all such modifications and similar structure.

What is claimed is:

1. A light emitting unit comprising:
a first semiconductor layer having a first electric property;
a second semiconductor layer having a second electric property disposed over the first semiconductor layer;
an active layer disposed between the first semiconductor layer and the second semiconductor layer;
a first electrode disposed on the second semiconductor layer;
a second electrode disposed under the first semiconductor layer; and
a phosphor layer disposed on the first semiconductor layer, wherein the phosphor layer covers the active layer and the second semiconductor layer, and wherein the first electrode is exposed out of the phosphor layer,
wherein the first semiconductor layer includes a top surface and a bottom surface opposite to the top surface, wherein the top surface includes a central portion and a peripheral portion lower than the central portion, wherein the active layer is disposed on the central portion, wherein the second electrode is disposed on the bottom surface, and wherein the central portion and part of the peripheral portion are covered by the phosphor layer.

2. The light emitting unit of claim 1, wherein the first semiconductor layer includes a top surface and a bottom surface opposite to the top surface, wherein the top surface includes a first portion and a second portion lower than the first portion, wherein the active layer is disposed on the first portion, wherein the second electrode is disposed on the bottom surface, and wherein the first portion and part of the second portion are covered by the phosphor layer.

3. The light emitting unit of claim 1, wherein the first electric property is n type and the second electric property is p type.

4. The light emitting unit of claim 1, wherein the first electric property is p type and the second electric property is n type.

5. The light emitting unit of claim 1, wherein a carrier is disposed under the second electrode.

6. A light emitting unit comprising:
a first semiconductor layer having a first electric property;
a second semiconductor layer having a second electric property disposed over the first semiconductor layer;
an active layer disposed between the first semiconductor layer and the second semiconductor layer;
a first electrode disposed on the second semiconductor layer;
a second electrode disposed under the first semiconductor layer; and
a phosphor layer disposed on the first semiconductor layer, wherein the phosphor layer covers the active layer and the second semiconductor layer, and wherein the first electrode is exposed out of the phosphor layer,
wherein the first semiconductor layer includes a top surface and a bottom surface opposite to the top surface, wherein the top surface includes a first portion and a second portion lower than the first portion, wherein the active layer is disposed on the first portion, wherein the second electrode is disposed on the bottom surface, and wherein the first portion and part of the second portion are covered by the phosphor layer.

7. The light emitting unit of claim 6, wherein the first electric property is n type and the second electric property is p type.

8. The light emitting unit of claim 6, wherein the first electric property is p type and the second electric property is n type.

9. The light emitting unit of claim 6, wherein a carrier is disposed under the second electrode.

* * * * *